US008259499B2

(12) United States Patent
Chang et al.

(10) Patent No.: US 8,259,499 B2
(45) Date of Patent: Sep. 4, 2012

(54) METHOD AND APPARATUS OF PERFORMING AN ERASE OPERATION ON A MEMORY INTEGRATED CIRCUIT

(75) Inventors: Yi-Fan Chang, Pingjhen (TW); Su-chueh Lo, Hsinchu (TW); Cheng Ming Yih, Hsinchu (TW); Ta Kang Chu, Hsinchu (TW); Chu Ching Wu, Jhubei (TW); Kuo Yu Liao, Jhubei (TW); Ken Hui Chen, Hsinchu (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 189 days.

(21) Appl. No.: 12/826,280

(22) Filed: Jun. 29, 2010

(65) Prior Publication Data

US 2011/0317493 A1 Dec. 29, 2011

(51) Int. Cl.
*G11C 11/34* (2006.01)

(52) U.S. Cl. ......... 365/185.11; 365/185.17; 365/185.18; 365/185.2; 365/185.22; 365/185.24; 365/185.27; 365/185.29; 365/185.33

(58) Field of Classification Search ............. 365/185.11, 365/185.17, 185.18, 185.2, 185.22, 185.24, 365/185.27, 185.29, 185.3, 185.33
See application file for complete search history.

(56) References Cited

U.S. PATENT DOCUMENTS

| 6,914,813 | B2 * | 7/2005 | Chevallier et al. | 365/185.11 |
|---|---|---|---|---|
| 6,987,696 | B1 | 1/2006 | Wang et al. | |
| 7,417,895 | B2 | 8/2008 | Cho | |
| 7,532,511 | B2 * | 5/2009 | Conley et al. | 365/185.11 |
| 7,606,076 | B2 * | 10/2009 | Nguyen et al. | 365/185.17 |
| 7,606,079 | B2 * | 10/2009 | Sekar et al. | 365/185.22 |
| 7,710,778 | B2 * | 5/2010 | Beltrami et al. | 365/185.17 |
| 7,907,449 | B2 * | 3/2011 | Lee et al. | 365/185.17 |
| 7,983,078 | B2 * | 7/2011 | Higashitani | 365/185.17 |
| 8,018,782 | B2 * | 9/2011 | Park et al. | 365/185.29 |
| 8,059,466 | B2 * | 11/2011 | Lee et al. | 365/185.18 |
| 2008/0175069 | A1 | 7/2008 | Wang et al. | |
| 2009/0180319 | A1 | 7/2009 | Kawamura | |

* cited by examiner

*Primary Examiner* — Trong Phan
(74) *Attorney, Agent, or Firm* — Kenta Suzue; Haynes Beffel & Wolfeld LLP (57) ABSTRACT

Various discussed approaches improve the over erase issue and the coupling effect, and include (A) multilevel contacts between (i) the first outer selected word line of an erase group, and (ii) the first unselected word line outside the ease group neighboring the first outer selected word line; (B) a sufficient separation distance between (i) the first outer selected word line of an erase group, and (ii) the first unselected word line outside the ease group neighboring the first outer selected word line. These are examples of electrically isolating (i) the first outer selected word line of an erase group, from (ii) the first unselected word line outside the ease group neighboring the first outer selected word line.

20 Claims, 10 Drawing Sheets

$$V_{FG0} = \alpha_{FW} * V_{WL0} + \alpha_{FWD}\alpha_{FF1} * V_{DWL} + \alpha_{FF2} * V_{WL2} + \alpha_{FB} * V_B + \alpha_{FD} * V_D + \frac{Q_{FG0} + \alpha_{FF1}Q_{FGD}}{C_T}$$

$$V_{FG1} = \alpha_{FW} * V_{WL1} + \alpha_{FW}\alpha_{FF2} * V_{WL2} + \alpha_{FB} * V_B + \alpha_{FD} * V_D + \frac{Q_{FG1} + \alpha_{FF2}Q_{FG2}}{C_T}$$

Fig. 3

WL0 = WL1
|DWL| < |WL2|
Δ|VFG0| < Δ|VFG1|

Fig. 9   Bulk = $V_{PWI}$   Fig. 10

$$\begin{cases} V_{FG0} = \alpha_{FW} * V_{WL0} + \alpha_{FW}\alpha_{FF1} * V_{WL1} + \alpha_{FB} * V_B + \alpha_{FD} * V_D + \dfrac{Q_{FG0} + \alpha_{FF1}Q_{FG1}}{C_T} \\ V_{FG1} = \alpha_{FW} * V_{WL1} + \alpha_{FW}\alpha_{FF1} * V_{WL0} + \alpha_{FB} * V_B + \alpha_{FD} * V_D + \dfrac{Q_{FG1} + \alpha_{FF1}Q_{FG0}}{C_T} \end{cases}$$

WL0 = WL1
VFG0 = VFG1

METHOD AND APPARATUS OF PERFORMING AN ERASE OPERATION ON A MEMORY INTEGRATED CIRCUIT

BACKGROUND

1. Field of the Invention

The technology relates to memory integrated circuits, in particular the erase operation of a nonvolatile memory integrated circuit.

2. Description of Related Art

Improvement of the over-erase effect from the erase operation has become an increasingly serious problem. Because of higher and higher memory array density, the floating gate coupling effect becomes even more serious.

However, present approaches of the erase operation of nonvolatile memory cells are inefficient. For example, in the erase operation of FIGS. 1-7 over-erased memory cells can result. In another example, such as US Patent Application Publication 2008/0175069, erase verify errors result in indiscriminate subdivision of an erase sector into two groups, followed by further subdivision into further groups, which results in a relatively complicated erase operation. In another example, the excessive use of dummy word lines (WLs) and dummy memory cells in U.S. Pat. No. 7,417,895 is wasteful of potentially usable memory cells.

SUMMARY

Embodiments of the technology address the over-erase issue associated with the floating gate coupling effect of edge WLs. The discussed approaches can even be used without requiring an increased array size. Improved endurance and erase time performance of memory cells result from addressing the over-erase issue in an erase operation.

Various discussed approaches that improve the over erase issue and the coupling effect, include (A) multilevel contacts (which can be drain or source side contacts that are bit lines/data lines that combine the drain side or source side of cells) between (i) the first outer selected word line of an erase group, and (ii) the first unselected word line outside the ease group neighboring the first outer selected word line; (B) a sufficient separation distance between (i) the first outer selected word line of an erase group, and (ii) the first unselected word line outside the ease group neighboring the first outer selected word line. These are examples of electrically isolating (i) the first outer selected word line of an erase group, from (ii) the first unselected word line outside the ease group neighboring the first outer selected word line.

Various names for an erase group are sector, block, bank, array, small sector, and small block.

One aspect of the technology is a memory apparatus with a plurality of memory cells, a plurality of word lines accessing the plurality of memory cells, a first plurality of multilevel contacts, and control circuitry.

The plurality of word lines is divided into a plurality of erase groups. Responsive to an erase command, an erase group is selected from the plurality of erase groups to receive an erase bias arrangement. The erase group includes at least a first outer selected word line bounding (i) the erase group of word lines selected to receive the erase bias arrangement, from (ii) unselected word lines outside the erase group. In some embodiments, the erase group also includes inner selected word lines, and the first outer selected word line of the erase group is positioned between the inner selected word lines of the erase group and the unselected word lines outside the erase group. The first outer selected word line neighbors a first unselected word line outside the erase group.

The first plurality of multilevel contacts is between (i) the first outer selected word line and (ii) the first unselected word line neighboring the first outer selected word line.

The control circuitry is responsive to the erase command by selecting the erase group from the plurality of erase groups to receive the erase bias arrangement, and applying the erase bias arrangement to the erase group.

In one embodiment, wherein responsive to the erase command, the control circuit applies an erase inhibit voltage to at least the first unselected word line (e.g., may also include other unselected word lines), at least partly while applying the erase bias arrangement to the erase group. In another embodiment, responsive to the erase command, the control circuit allows the first unselected word line to float (and other unselected word lines grounded or receiving the erase inhibit voltage), at least partly while applying the erase bias arrangement to the erase group.

In various embodiments, the first unselected word line is a dummy word line; or the first unselected word line is not a dummy word line, and during regular operation accesses memory cells of the plurality of memory cells.

In one embodiment, the erase group includes a second outer selected word line bounding (i) the erase group of word lines selected to receive the erase bias arrangement, from (ii) unselected word lines outside the erase group. The second outer selected word line neighbors a second unselected word line outside the erase group. For example, the first and second outer selected word lines are on opposite sides of the erase group (e.g., first WL and last WL of an erase group). The apparatus includes a second plurality of multilevel contacts between (i) the second outer selected word line and (ii) the second unselected word line neighboring the second outer selected word line.

One embodiment further comprises a plurality memory elements under the plurality of word lines, including a first memory element under the first outer selected word line, and a second memory element under the first unselected word line neighboring the first outer selected word line. The first plurality of multilevel contacts is between (i) the first memory element under the first outer selected word line and (ii) the second memory element under the first unselected word line neighboring the first outer selected word line. Examples of the memory element are floating gates and charge trapping material. Examples of the array are NAND arrays and NOR arrays and embedded memory.

One aspect of the technology is a memory apparatus with a plurality of memory cells, a plurality of word lines accessing the plurality of memory cells, and control circuitry.

Figure 15:
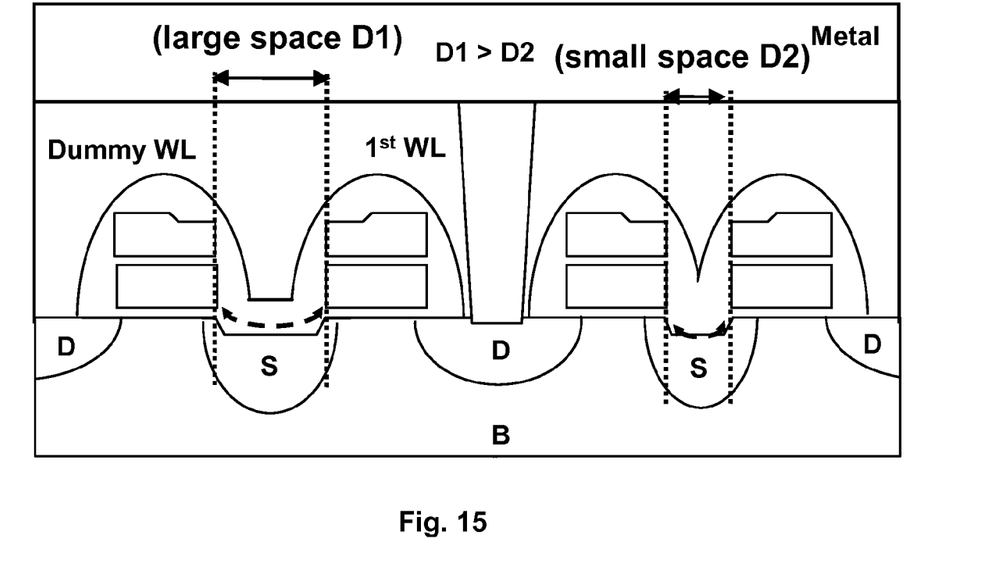
FIG. 15, corresponding to FIG. 14, shows a side view of an array structure of word lines with a large distance separating an outer word line of an erase group from a neighboring word line outside the erase group, resulting in suppressed floating gate coupling effect.

The plurality of word lines is divided into a plurality of erase groups. Responsive to an erase command, an erase group is selected from the plurality of erase groups to receive an erase bias arrangement. The erase group includes at least a first outer selected word line and a first inner selected word line. The outer selected word line bounds (i) the erase group of word lines selected to receive the erase bias arrangement, from (ii) unselected word lines outside the erase group. The first inner selected word line is adjacent to the first outer selected word line. The first outer selected word line neighbors (i) the first inner selected word line and (ii) a first unselected word line outside the erase group. A first distance separates the first outer selected word line from the first unselected word line. A second distance separates the first inner selected word line from the first outer selected word line. The first distance is greater than the second distance. Examples of these distances are shown in FIG. 15.

The control circuitry is responsive to the erase command by selecting the erase group from the plurality of erase groups to receive the erase bias arrangement, and applying the erase bias arrangement to the erase group.

In one embodiment, wherein responsive to the erase command, the control circuit applies an erase inhibit voltage to the first unselected word line, at least partly while applying the erase bias arrangement to the erase group. In another embodiment, responsive to the erase command, the control circuit allows the first unselected word line to float, at least partly while applying the erase bias arrangement to the erase group.

In various embodiments, the first unselected word line is a dummy word line; or the first unselected word line is not a dummy word line, and during regular operation accesses memory cells of the plurality of memory cells.

An aspect of the technology is an operation method of a memory, including the following steps:
performing on a memory integrated circuit having a plurality of word lines divided into a plurality of erase groups, an erase command selecting an erase group to receive an erase bias arrangement including:
applying the erase bias arrangement to word lines in the erase group, wherein the erase group includes:
at least a first outer selected word line bounding (i) the erase group of word lines selected to receive the erase bias arrangement, from (ii) unselected word lines outside the erase group,
wherein the first outer selected word line neighbors a first unselected word line outside the erase group; and
electrically isolating (i) a first memory element under the first outer selected word line from (ii) a second memory element under the first unselected word line neighboring the first outer selected word line.

In one embodiment the step of electrically isolating, is performed by a plurality of multilevel contacts between (i) the first outer selected word line and (ii) the first unselected word line neighboring the first outer selected word line.

Figure 14:
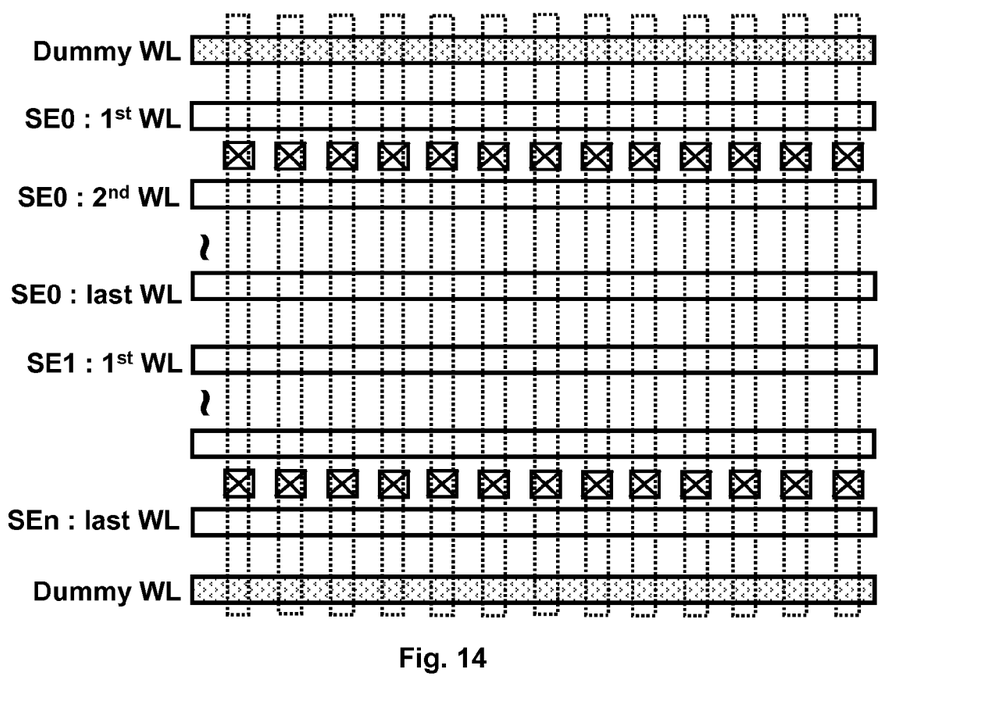
FIG. 14 shows a top view of an array structure of word lines with a large distance separating an outer word line of an erase group from a neighboring word line outside the erase group, resulting in suppressed floating gate coupling effect.

In one embodiment the first outer selected word line neighbors (i) the first unselected word line outside the erase group and (ii) a first inner selected word line in the erase group. The step of electrically isolating is performed by a first distance separating the first outer selected word line from the first unselected word line. The first distance is greater than a second distance separating the inner selected word line from the first outer selected word line. An example is shown by FIG. 14, which shows that the distance D1 is greater than the distance D2.

One embodiment further comprises:
responsive to the erase command, applying an erase inhibit voltage to the first unselected word line, at least partly while applying the erase bias arrangement to the erase group.

Another embodiment further comprises:
responsive to the erase command, allowing the first unselected word line to float, at least partly while applying the erase bias arrangement to the erase group.

In various embodiments, the first unselected word line is a dummy word line; or the first unselected word line is not a dummy word line, and during regular operation accesses memory cells of the plurality of memory cells.

Examples of the first and second memory elements are floating gates and charge trapping material. Examples of the array are NAND arrays and NOR arrays and embedded memory.

Various other embodiments are discussed herein.

An aspect of the technology is a method, including the following steps:
Various other embodiments are discussed herein.

BRIEF DESCRIPTION OF THE DRAWINGS

FIGS. 2 and 3 illustrate the floating gate coupling effect, by contrasting different floating gate voltages that result from being coupled to an adjacent floating gate of a dummy word line, versus being coupled to an floating gate of a word line that is part of the same erase group, where FIG. 2 shows the adjacent word lines receiving different voltages (such as a negative voltage applied to word lines of a selected erase group, and a positive voltage applied to other word lines outside the selected erase group) and FIG. 3 shows the adjacent word lines receiving the same voltages.

DETAILED DESCRIPTION

Figure 1:
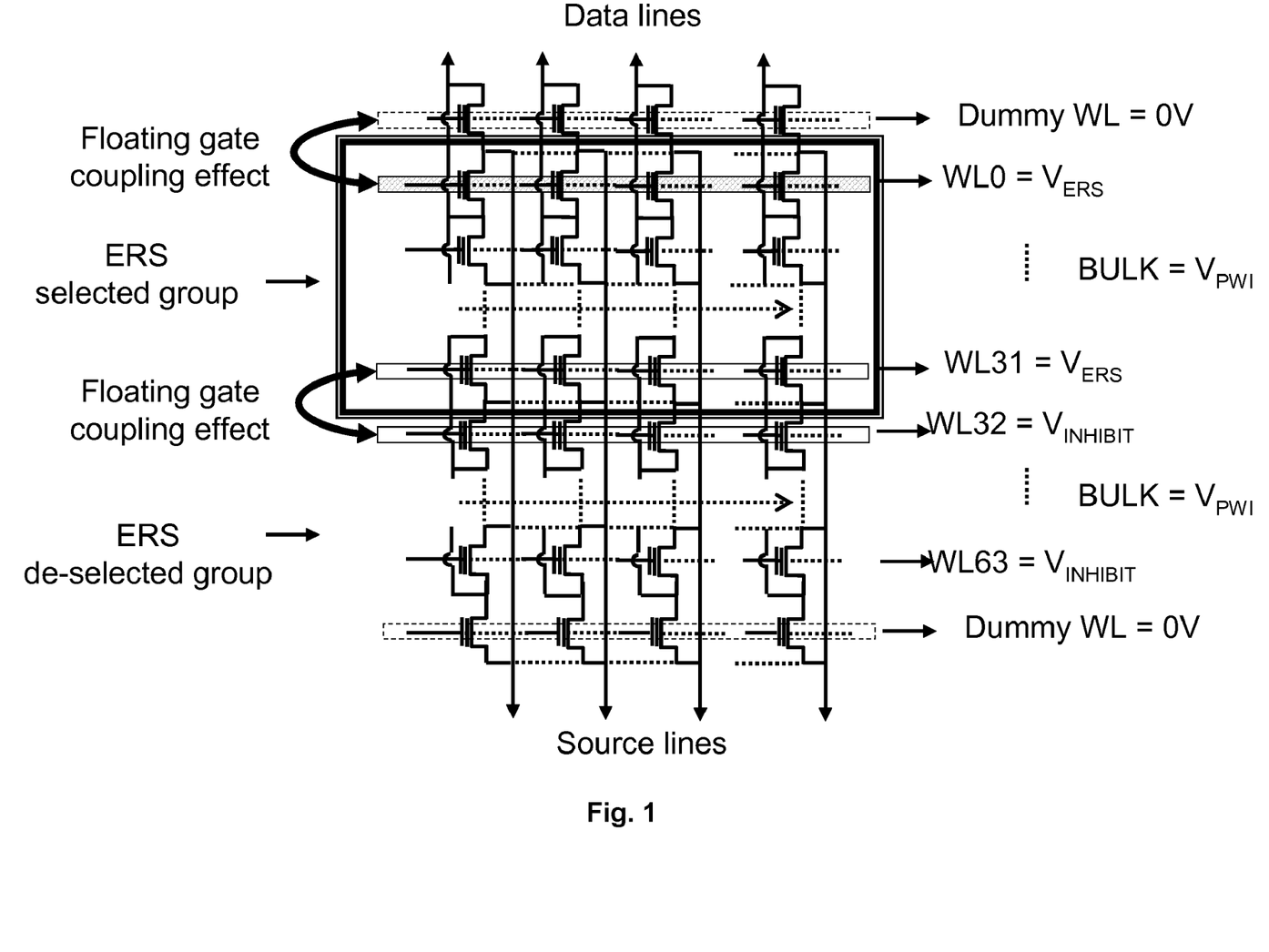
FIG. 1 is a block diagram of a memory array portion with multiple erase groups, showing the floating gate coupling effect between adjacent erase groups.

FIG. 1 is a block diagram of a memory array portion with multiple erase groups, showing the floating gate coupling effect between adjacent erase groups.

Common examples of an erase group are erase sectors and erase blocks that include word lines which access memory cells erased together, responsive to an erase command identifying a particular erase sector or erase block to be erased.

In particular, FIG. 1 shows that neighboring memory cells have a coupling effect when the neighboring memory cells are accessed by WLs having different voltage levels. Accordingly, the outer WLs of an erase group have a floating gate coupling effect during an erase operation. The coupling effect impacts Vt uniformity after an erase an operation due to the coupling effect between a floating of an outer WL of a selected erase group with a floating gate of a neighboring dummy WL, or between a floating of an outer WL a selected erase group and the floating gate of an outer WL of an adjacent unselected erase group.

The memory array portion of FIG. 1 is accessed by vertically oriented Data lines and Source lines, and horizontally oriented word lines. In order from the top to the bottom of the array portion, the word lines include top Dummy WL biased at 0V, a group of 32 word lines selected for erase ("ERS selected group") numbered from WL0 to WL31 biased at VERS, a group of 32 word lines not selected for erase ("ERS de-selected group") numbered from WL32 to WL63 biased at VINHIBIT, and bottom Dummy WL biased at 0V. The bulk is biased at VPWI. The floating gate coupling effect between neighboring word lines in the "ERS selected group" and other word lines. There is a "Floating gate coupling effect" between the neighboring top Dummy WL outside the "ERS selected group" and WL0 in the "ERS selected group". There is a "Floating gate coupling effect" between the neighboring WL32 outside the "ERS selected group" and WL31 in the "ERS selected group".

Figures 2, 3:
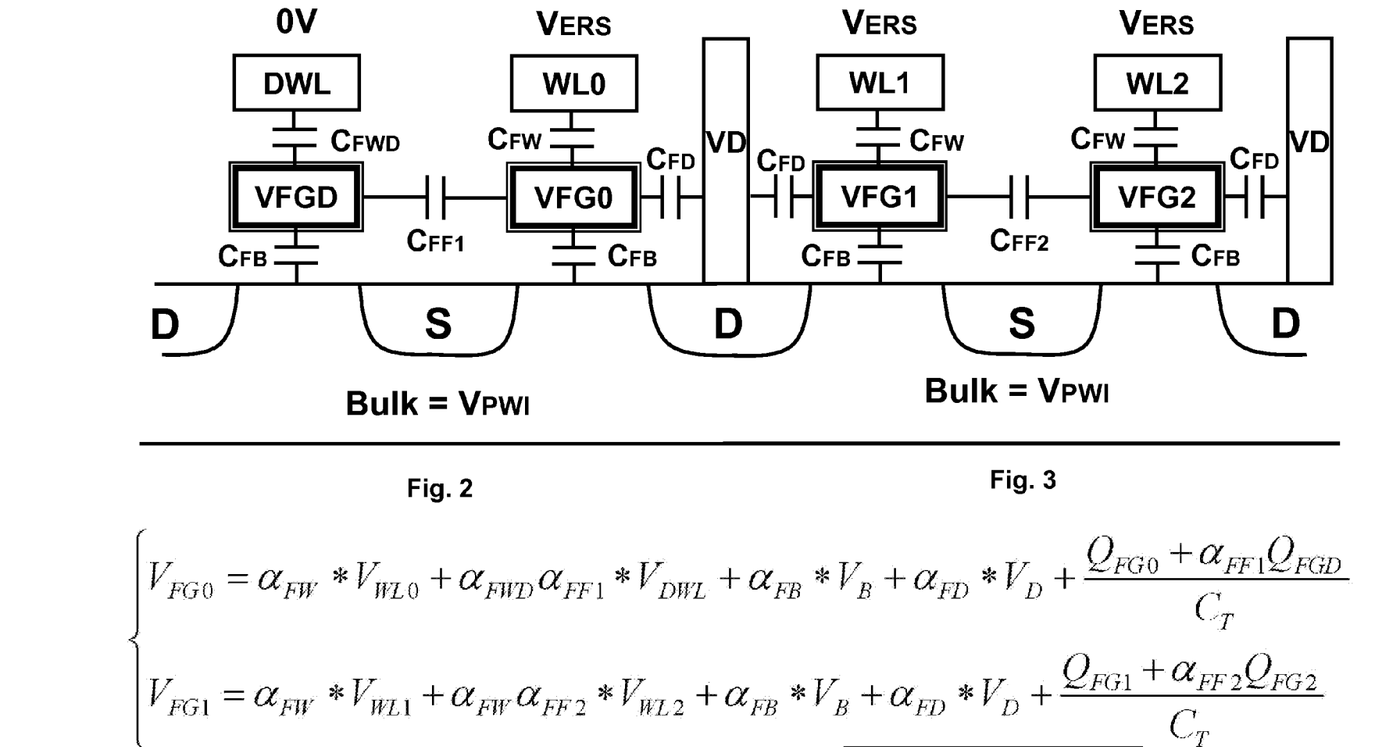

FIGS. 2 and 3 illustrate the floating gate coupling effect, by contrasting different floating gate voltages that result from being coupled to an adjacent floating gate of a dummy word line, versus being coupled to an floating gate of a word line that is part of the same erase group, where FIG. 2 shows the adjacent word lines receiving different voltages (such as a negative voltage applied to word lines of a selected erase group, and a positive voltage applied to other word lines outside the selected erase group) and FIG. 3 shows the adjacent word lines receiving the same voltages.

In FIGS. 2 and 3, $V_{FG}$ is the floating gate voltage of a cell, CFF is the cell to cell parasitic capacitance, CFB is the cell to body capacitance, CFD is the cell to drain capacitance, CFW is the cell to word line capacitance, and CFWD is the cell to dummy word line capacitance.

FIG. 2 shows the adjacent word lines receiving different voltages 0V and VERS. Dummy word line DWL is biased at 0V, and adjacent word line WL0 is biased at VERS. Dummy word line DWL is coupled to a floating gate at voltage VFGD by capacitance CFWD, which is coupled to the body by capacitance CFB. Word line WL0 is coupled to a floating gate at voltage VFG0 by capacitance CFW, which is coupled to the body by capacitance CFB and coupled to the drain contact by capacitance CFD. The neighboring floating gates are coupled by capacitance CFF1.

FIG. 3 shows the adjacent word lines receiving the same voltage VERS. Word line WL1 and adjacent word line WL2 are biased at VERS. Word line WL1 is coupled to a floating gate at voltage VFG1 by capacitance CFW, which is coupled to the body by capacitance CFB and coupled to the drain contact by capacitance CFD. Word line WL2 is coupled to a floating gate at voltage VFG2 by capacitance CFW, which is coupled to the body by capacitance CFB and coupled to the drain contact by capacitance CFD. The neighboring floating gates are coupled by capacitance CFF2.

In FIGS. 2 and 3, the bulk is biased at VPWI. The bulk includes alternating source lines S and drain lines D.

Figure 4:
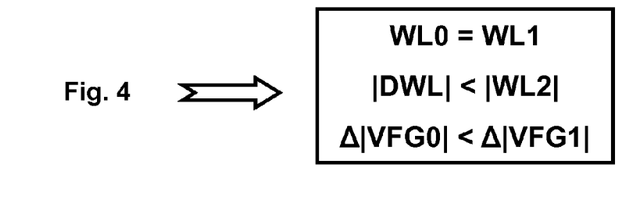
FIG. 4 shows equations of the floating gate voltages accounting for capacitive coupling, and applies the equations to show the floating gate coupling effect from the different arrangements of FIGS. 2 and 3.

FIG. 4 shows equations of the floating gate voltages accounting for capacitive coupling, and applies the equations to show the floating gate coupling effect from the different arrangements of FIGS. 2 and 3.

The various α values represent coupling to the floating gate from a neighboring node. In particular, αFW is the coupling value for CFW (word line), αFF is the coupling value for CFF (neighboring floating gate), αFB is the coupling value for CFB (body) and αFD is the coupling value for CFD (drain). Q refers to the charge stored on the respective floating gates, and CT is the nominal capacitance of the floating gate.

The floating gate voltage VFG0 has the following equation:

$$V_{FG0}=\alpha_{FW}*V_{WL0}+\alpha_{FWD}\alpha_{FF1}*V_{DWL}+\alpha_{FB}*V_B+\alpha_{FD}*V_D+((Q_{FG0}+\alpha_{FF1}Q_{FGD})/C_T)$$

The floating gate voltage VFG1 has the following equation:

$$V_{FG1}=\alpha_{FW}*V_{WL1}+\alpha_{FW}\alpha_{FF2}*V_{WL2}+\alpha_{FB}*V_B+\alpha_{FD}*V_D+((Q_{FG1}+\alpha_{FF2}Q_{FG2})/C_T)$$

When the voltage of WL0 is equal to the voltage of WL1, WL0=WL1, and the voltages of DWL and WL the same too, then $C_{FG}$ (coupling capacitance value, $Q_T=C_{FG}*V_{FG}$) will be unchanged, and the voltage VFG1 is largely equal to the voltage VFG0. But the voltage magnitude of WL2 is greater than the voltage magnitude of DWL, |DWL|<|WL2|, so the voltage difference Δ|VFG0| (due to floating gate coupling with floating gate FG0) is smaller than the voltage difference Δ|VFG1| (due to floating gate coupling with floating gate FG1), Δ|VFG0|<Δ|VFG1|. Accordingly, due to floating gate coupling between neighboring floating gates FGD and FG0, and floating gate coupling between neighboring floating gates FG1 and FG2, VFG0≠VFG1.

Figure 5:
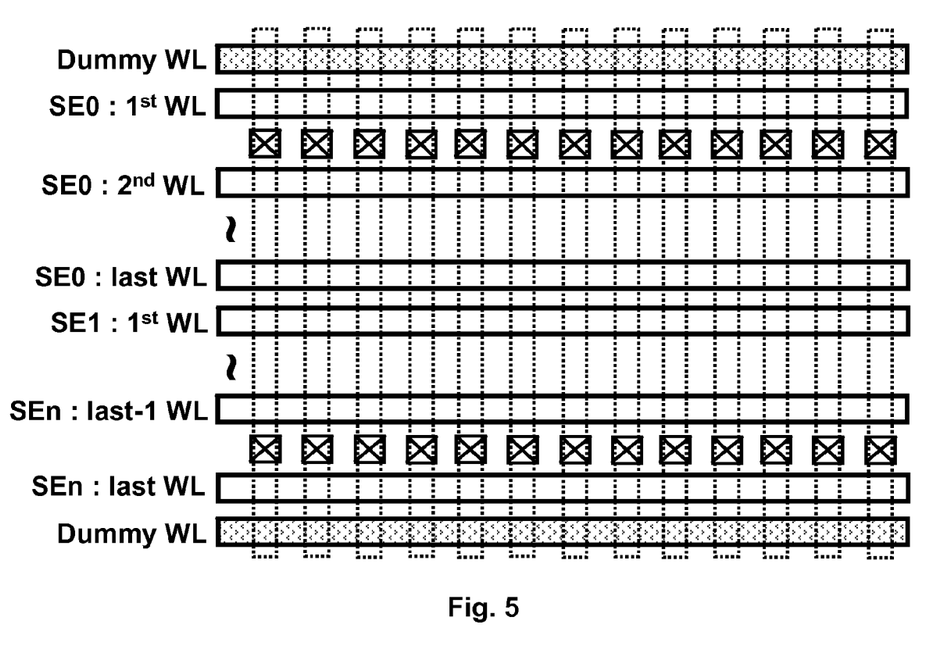
FIG. 5 shows a top view of an array structure of word lines with a short distance separating an outer word line of an erase group from a neighboring word line outside the erase group, resulting in the floating gate coupling effect.

FIG. 5 shows a top view of an array structure of word lines with a short distance separating an outer word line of an erase group from a neighboring word line outside the erase group, resulting in the floating gate coupling effect. The short distance is because the cells of the outer word lines have a soruce side which connects with the dummy word line cells.

In order from the top to the bottom of the array structure, the word lines include top Dummy WL, word lines of erase sectors numbered from SE0, SE1, through Sen, and bottom Dummy WL. Individually shown word lines of the erase sectors include a $1^{st}$ WL, $2^{nd}$ WL, and last WL of SE0; $1^{st}$ WL of SE1; and last—1 WL and last WL of Sen.

Figure 6:
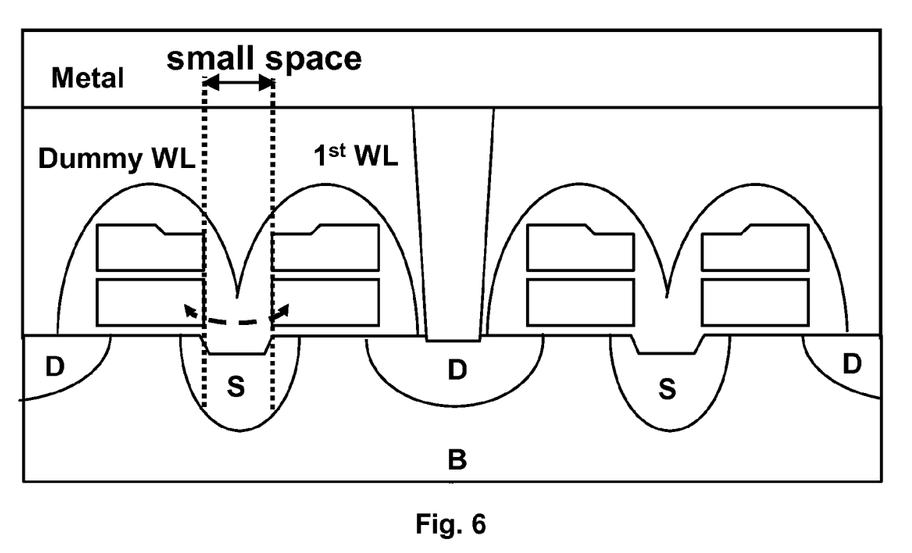
FIG. 6, corresponding to FIG. 5, shows a side view of an array structure of word lines with a short distance separating an outer word line of an erase group from a neighboring word line outside the erase group, resulting in the floating gate coupling effect.

FIG. 6, corresponding to FIG. 5, shows a side view of an array structure of word lines with a short distance separating an outer word line of an erase group from a neighboring word line outside the erase group, resulting in the floating gate coupling effect.

In body B there are alternating source lines S and drain lines D. A metal line is connected to a drain D by a drain contact. The neighboring word lines Dummy WL and $1^{st}$ WL (such as of SE0) are separated by a "small space".

Figure 7:
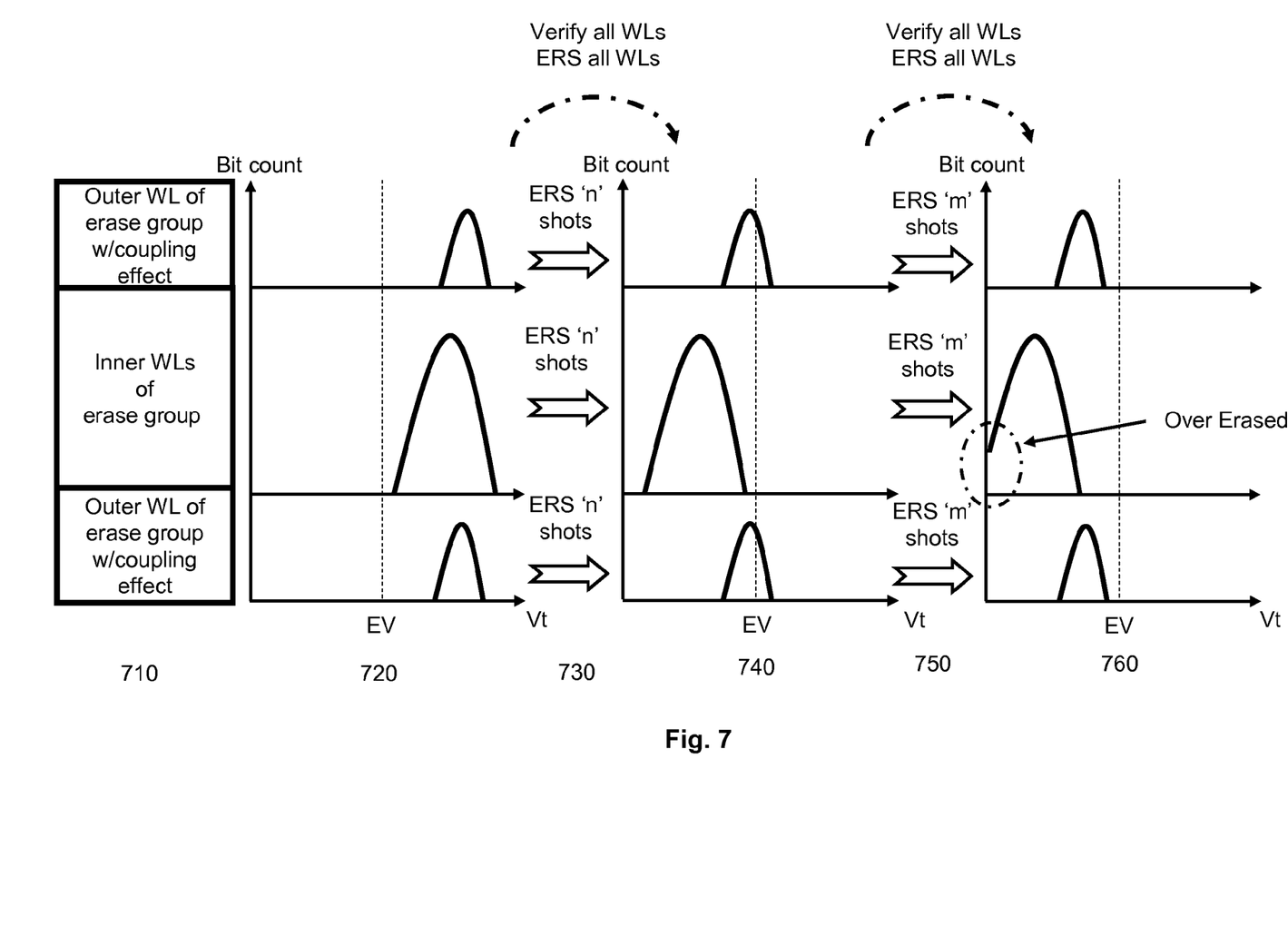
FIG. 7 shows multiple steps of an erase operation with multiple sub-operations of erase and erase verify, to show that relying on an erase verify sub-operation on an outer word line of the erase group, to perform an erase sub-operation on all word lines of the erase group, results in over-erasing of center word lines in the erase group.

FIG. 7 shows multiple steps of an erase operation with multiple sub-operations of erase and erase verify, to show that relying on an erase verify sub-operation on an outer word line of the erase group, to perform an erase sub-operation on all word lines of the erase group, results in over-erasing of center word lines in the erase group.

In 710, the WLs of an erase group are shown as the center WLs of an erase group ("Inner WLs of erase group"), between edge WLs of the erase group (top "Outer WL of erase group w/coupling effect" and bottom "Outer WL of erase group w/coupling effect"). In 720, the threshold voltage distributions are shown for the center and edge WLs, with horizontal axis of threshold voltage Vt and vertical axis "Bit count". Subsequently, "Verify all WLs" and "ERS all WLs" are performed as follows. In 730, 'n' erase shots are performed on all WLs ("ERS 'n' shots"). In the threshold voltage distributions shown for the center and edge WLs 740, with horizontal axis of threshold voltage Vt and vertical axis "Bit count", the center WLs of an erase pass erase verify (erase verify voltage "EV" indicated by vertical dashed line), but edge WLs fail erase verify, due to the floating gate coupling effect. Subsequently, "Verify all WLs" and "ERS all WLs" are performed as follows. In 750, 'm' erase shots are performed on all WLs ("ERS 'n' shots"). In the threshold voltage distributions shown for the center and edge WLs 760, with horizontal axis of threshold voltage Vt and vertical axis "Bit count", although the edge WLs have passed erase verify (erase verify voltage "EV" indicated by vertical dashed line), the center WL region has over-erased. Accordingly, the floating gate coupling effect caused the Vt distribution to over-erase (circled in 760 with dashed line and indicated as "Over Erased") in the center WL region.

Figure 8:
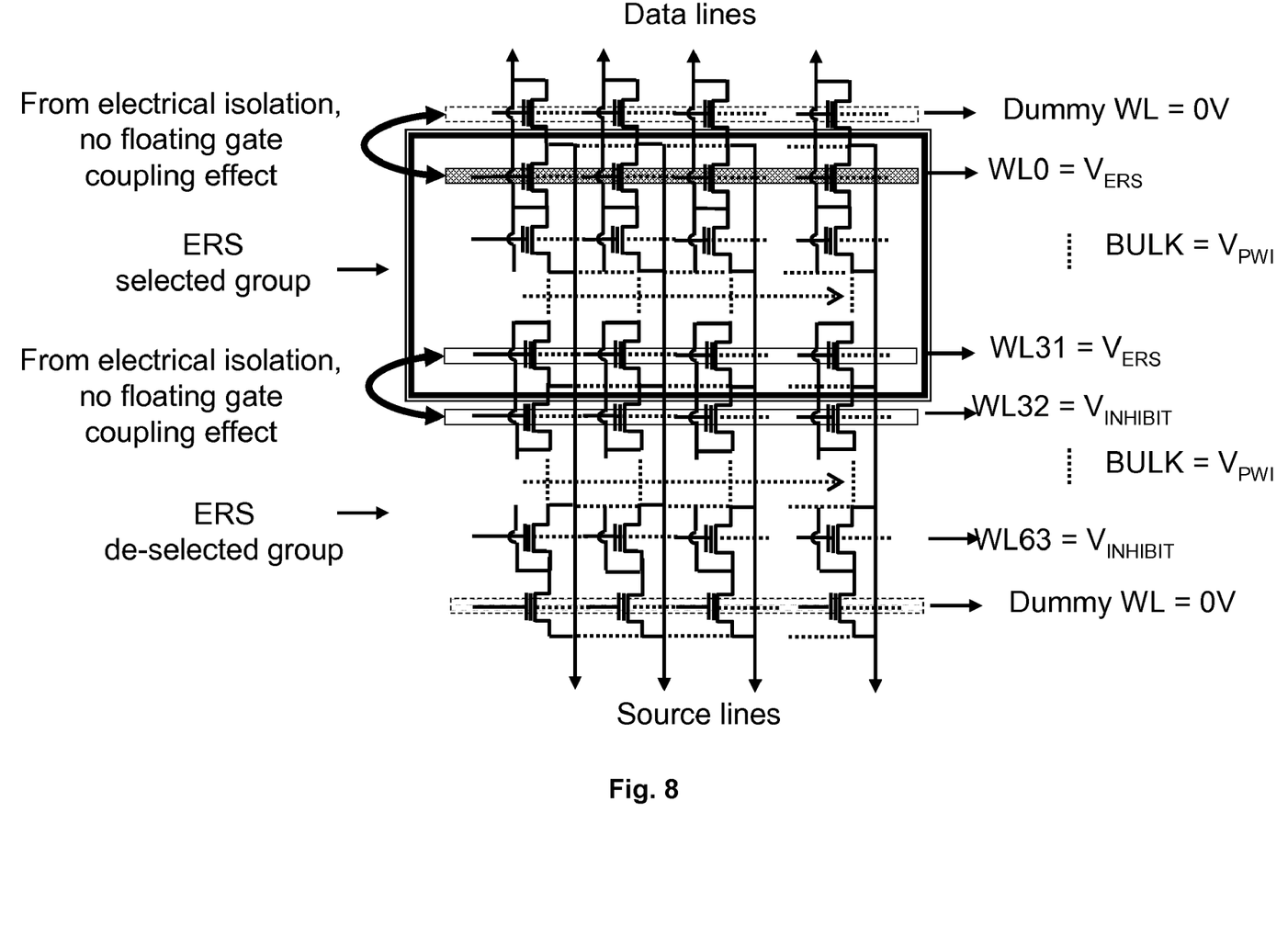
FIG. 8 is a block diagram of a memory array portion with multiple erase groups, showing that electrical isolation between an outer word line of an erase group and a neighboring word line outside the erase group, helps to suppress the floating gate coupling effect between adjacent word lines of different erase groups.

FIG. 8 is a block diagram of a memory array portion with multiple erase groups, showing that electrical isolation between an outer word line of an erase group and a neighboring word line outside the erase group, helps to suppress the floating gate coupling effect between adjacent word lines of different erase groups.

The top erase group includes word lines WL0 to WL31, with outer word lines WL0 and WL31, and inner word lines WL1 through WL30. The bottom erase group includes word lines WL32 to WL63, with outer word lines WL32 and WL63, and inner word lines WL33 through WL62.

In particular, FIG. 8 shows that neighboring memory cells have no coupling effect or suppressed coupling effect, with electrical isolation, via drain side shielding, between floating gates of adjacent WLs, despite the adjacent WLs having different voltage levels. Accordingly, the outer WLs of an erase group have suppressed floating gate coupling effect during an erase operation.

The erase voltage Vers is applied to world lines of the selected regions, to erase memory cells that are inside the erase group selected for erase. Also shown is the inhibit voltage Vinhibit applied to word lines of deselected regions, which inhibits erase in memory cells that are outside of the erase group selected for erase.

The memory array portion of FIG. 8 is accessed by vertically oriented Data lines and Source lines, and horizontally oriented word lines. In order from the top to the bottom of the array portion, the word lines include top Dummy WL biased at 0V, a group of 32 word lines selected for erase ("ERS selected group") numbered from WL0 to WL31 biased at VERS, a group of 32 word lines not selected for erase ("ERS de-selected group") numbered from WL32 to WL63 biased at VINHIBIT, and bottom Dummy WL biased at 0V. The bulk is biased at VPWI. The floating gate coupling effect between neighboring word lines in the "ERS selected group" and other word lines. "From electrical isolation, no floating gate coupling effect" exists between the neighboring top Dummy WL outside the "ERS selected group" and WL0 in the "ERS selected group". "From electrical isolation, no floating gate coupling effect" exists between the neighboring WL32 outside the "ERS selected group" and WL31 in the "ERS selected group".

Figures 9, 10, 11:
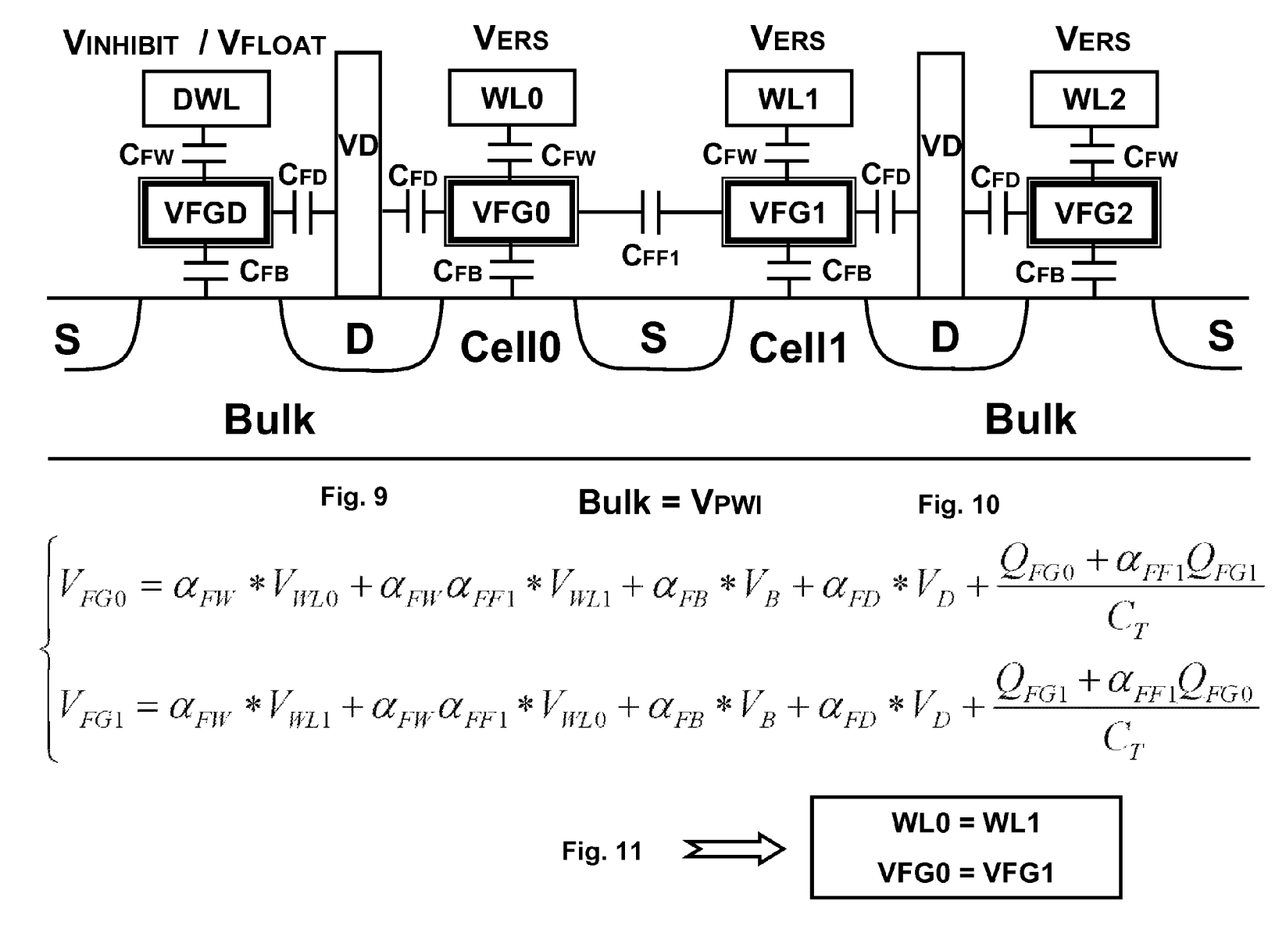
FIGS. 9 and 10 illustrate a suppressed floating gate coupling effect, by showing common floating gate voltages that result from being adjacent to a multilevel contact that electrically isolates floating gates of outer word lines of an erase group from floating gates of neighboring word lines outside the erase group.
FIG. 11 shows equations of the floating gate voltages accounting for capacitive coupling, and applies the equations to show the absence of a floating gate coupling effect from the arrangements of FIGS. 9 and 10.

FIGS. 9 and 10 illustrate a suppressed floating gate coupling effect, by showing common floating gate voltages that result from being adjacent to a multilevel contact (shown as drain side contacts) that electrically isolates floating gates of outer word lines of an erase group from floating gates of neighboring word lines outside the erase group.

In FIGS. 9 and 10, $V_{FG}$ is the floating gate voltage of a cell, CFF is the cell to cell parasitic capacitance, CFB is the cell to body capacitance, CFD is the cell to drain capacitance, CFW is the cell to word line capacitance, and CFWD is the cell to dummy word line capacitance.

FIG. 9 shows the adjacent word lines receiving different voltages VINHIBIT/VFLOAT and VERS. Dummy word line DWL is biased at VINHIBIT/VFLOAT, and adjacent word line WL0 is biased at VERS. Dummy word line DWL is coupled to a floating gate at voltage VFGD by capacitance CFW, which is coupled to the body by capacitance CFB and coupled to the drain contact by capacitance CFD. Word line WL0 is coupled to a floating gate at voltage VFG0 by capacitance CFW, which is coupled to the body by capacitance CFB and coupled to the drain contact by capacitance CFD. Unlike FIG. 2, with the intervening drain contact biased at VD, the neighboring floating gates, which are coupled to word lines receiving different voltages, are not coupled by capacitance CFF1.

FIG. 10 shows the adjacent word lines receiving the same voltage VERS. Word line WL1 and adjacent word line WL2 are biased at VERS. Word line WL1 is coupled to a floating gate at voltage VFG1 by capacitance CFW, which is coupled to the body by capacitance CFB and coupled to the drain contact by capacitance CFD. Word line WL2 is coupled to a floating gate at voltage VFG2 by capacitance CFW, which is coupled to the body by capacitance CFB and coupled to the drain contact by capacitance CFD. Unlike FIG. 2, with the intervening drain contact biased at VD, the neighboring floating gates, which are coupled to word lines receiving the same voltage, are not coupled by capacitance CFF2.

The neighboring floating gates at voltages VFG0 and VFG1 are coupled by capacitance CFF1. Memory "Cell0" includes the floating gate at voltage VFG0 coupled to word line WL0. Memory "Cell1" includes the floating gate at voltage VFG1 coupled to word line WL1. In FIGS. 9 and 10, the bulk is biased at VPWI. The bulk includes alternating source lines S and drain lines D.

FIG. 11 shows equations of the floating gate voltages accounting for capacitive coupling, and applies the equations to show the absence of a floating gate coupling effect from the arrangements of FIGS. 9 and 10.

The various α values represent coupling to the floating gate from a neighboring node. In particular, αFW is the coupling value for CFW (word line), αFF is the coupling value for CFF (neighboring floating gate), αFB is the coupling value for CFB (body) and αFD is the coupling value for CFD (drain).

Q refers to the charge stored on the respective floating gates, and CT is the nominal capacitance of the floating gate.

The floating gate voltage VFG0 has the following equation:

$$V_{FG0} = \alpha_{FW}*V_{WL0} + \alpha_{FW}\alpha_{FF1}*V_{WL1} + \alpha_{FB}*V_B + \alpha_{FD}*V_D + ((Q_{FG0} + \alpha_{FF1}Q_{FG1})/C_T)$$

The floating gate voltage VFG1 has the following equation:

$$V_{FG1} = \alpha_{FW}*V_{WL1} + \alpha_{FW}\alpha_{FF1}*V_{WL0} + \alpha_{FB}*V_B + \alpha_{FD}*V_D + ((Q_{FG1} + \alpha_{FF1}Q_{FG0})/C_T)$$

The multilevel bit line drain contact electrically isolates the neighboring floating gates FGD and FG0 from each other. The multilevel bit line drain contact also electrically isolates the neighboring floating gates FG1 and FG2 from each other. Despite the voltage magnitude of WL2 being greater than the voltage magnitude of DWL, such electrical isolation suppresses floating gate coupling between neighboring floating gates FGD and FG0, and suppresses floating gate coupling between neighboring floating gates FG1 and FG2. Accordingly, when the voltage of WL0 is equal to the voltage of WL1, WL0=WL1, then neighboring floating gates are equal, VFG0=VFG1, despite the different floating gate voltages of the adjacent floating gates VFGD≠VFG2, which in the absence of the multilevel bit line drain contact, would cause VFG0≠VFG1.

Figure 12:
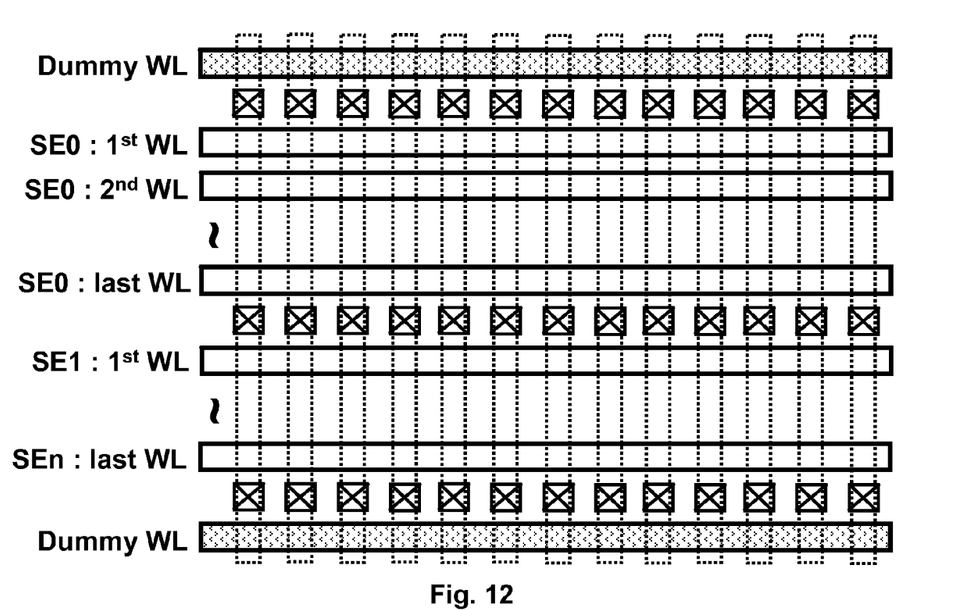
FIG. 12 shows a top view of an array structure of word lines with a multilevel contact separating an outer word line of an erase group from a neighboring word line outside the erase group, resulting in suppressed floating gate coupling effect.

FIG. 12 shows a top view of an array structure of word lines with a multilevel contact (shown as drain side contacts between dummy word line and WL0) separating an outer word line of an erase group from a neighboring word line outside the erase group, resulting in suppressed floating gate coupling effect.

In order from the top to the bottom of the array structure, the word lines include top Dummy WL, word lines of erase sectors numbered from SE0, SE1, through Sen, and bottom Dummy WL. Individually shown word lines of the erase sectors include a $1^{st}$ WL, $2^{nd}$ WL, and last WL of SE0; $1^{st}$ WL of SE1; and last WL of Sen.

The array structure is divided into multiple erase groups, of sectors 0(SE0) through sector n (SEn). Each sector includes outer word lines ($1^{st}$ WL and last WL) and inner word lines ($2^{nd}$ WL through next to last WL).

The bottom dummy word line and the last word line of sector n (SEn: last WL) share a common drain multilevel contact, to eliminate the coupling effect. The top dummy word line and the first word line of sector 0 (SE0: 1st WL) share a common drain multilevel contact, to eliminate the coupling effect.

The number of dummy word lines can be 1, 2, or more.

The last word line of sector 0 (SE0: last WL) and the first word line of sector 1 (SE1: 1st WL) share a common drain multilevel contact, to eliminate the coupling effect. Generally between sector 0 to sector n, the last word line of a preceding sector and the first word line of a subsequent sector share a common drain multilevel contact, to eliminate the coupling effect.

During erase of the selected erase group, the voltage of the dummy word line is coupled to a Vinhibit voltage or left floating. During erase of the selected erase group, the voltage of the other word lines outside the selected erase group, are also coupled to a Vinhibit voltage or left floating.

Figure 13:
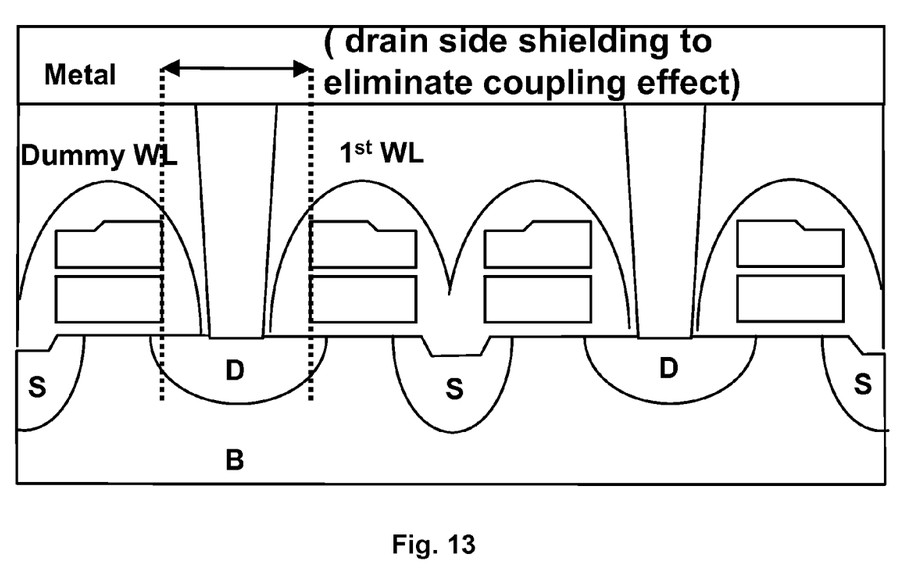
FIG. 13, corresponding to FIG. 12, shows a side view of an array structure of word lines with a multilevel contact separating an outer word line of an erase group from a neighboring word line outside the erase group, resulting in suppressed floating gate coupling effect.

FIG. 13, corresponding to FIG. 12, shows a side view of an array structure of word lines with a multilevel contact separating an outer word line of an erase group from a neighboring word line outside the erase group, resulting in suppressed floating gate coupling effect.

In body B there are alternating source lines S and drain lines D. A metal line is connected to a drain D by a drain contact. The drain contact separates the neighboring word lines Dummy WL and $1^{st}$ WL (such as of SE0). The dummy word line ("Dummy WL") and the outer word line (e.g., first WL ("$1^{st}$ WL")) or last WL) of a sector share a common drain multilevel contact, to eliminate the coupling effect ("drain side shielding to eliminate coupling effect"). Also, the neighboring outer word lines of neighboring sectors (e.g., last WL of sector x and first WL of sector (x+1) share a common drain multilevel contact, to eliminate the coupling effect. Generally between sector 0 to sector n, The last word line of a preceding sector and the first word line of a subsequent sector share a common drain multilevel contact, to eliminate the coupling effect.

In some embodiments, the multilevel contacts are used to eliminate the coupling effect only for dummy word lines, or only between neighboring sectors, or only between a subset of neighboring sectors, or some combination.

FIG. 14 shows a top view of an array structure of word lines with a large distance separating an outer word line of an erase group from a neighboring word line outside the erase group, resulting in suppressed floating gate coupling effect.

In order from the top to the bottom of the array structure, the word lines include top Dummy WL, word lines of erase sectors numbered from SE0, SE1, through Sen, and bottom Dummy WL. Individually shown word lines of the erase sectors include a $1^{st}$ WL, $2^{nd}$ WL, and last WL of SE0; $1^{st}$ WL of SE1; and last WL of Sen.

The array structure is divided into multiple erase groups, of sectors 0 (SE0) through sector n (SEn). Each sector includes outer word lines ($1^{st}$ WL and last WL) and inner word lines ($2^{nd}$ WL through next to last WL).

The bottom dummy word line and the last word line of sector n (SEn: last WL) are separated by a large space, to eliminate the coupling effect. The top dummy word line and the first word line of sector 0 (SE0: 1st WL) are separated by a large space, to eliminate the coupling effect.

The number of dummy word lines can be 1, 2, or more.

The last word line of sector 0 (SE0: last WL) and the first word line of sector 1 (SE1: 1st WL) are separated by a large space, to eliminate the coupling effect. Generally between sector 0 to sector n, the last word line of a preceding sector and the first word line of a subsequent sector are separated by a large space, to eliminate the coupling effect.

During erase of the selected erase group, the voltage of the dummy word line is coupled to a Vinhibit voltage or left floating. During erase of the selected erase group, the voltage of the other word lines outside the selected erase group, are also coupled to a Vinhibit voltage or left floating.

FIG. 15, corresponding to FIG. 14, shows a side view of an array structure of word lines with a large distance separating an outer word line of an erase group from a neighboring word line outside the erase group, resulting in suppressed floating gate coupling effect.

In body B there are alternating source lines S and drain lines D. A metal line is connected to a drain D by a drain contact. The dummy word line and the outer word line (e.g., first WL or last WL) of a sector are separated by a large space ("large space D1"), to eliminate the coupling effect. Also, the neighboring outer word lines of neighboring sectors (e.g., last WL of sector x and first WL of sector (x+1) are separated by a large space, to eliminate the coupling effect. Generally between sector 0 to sector n, The last word line of a preceding sector and the first word line of a subsequent sector are separated by a large space, to eliminate the coupling effect.

An example of a large separation (such as "large space D1"), is any word line separation distance larger than the word line separation distance (such as "small space D2", where "D1>D2") used between other word lines without the coupling effect issue.

In some embodiments, the large separation distances are used to eliminate the coupling effect only for dummy word lines, or only between neighboring sectors, or only between a subset of neighboring sectors, or some combination.

Figure 16:
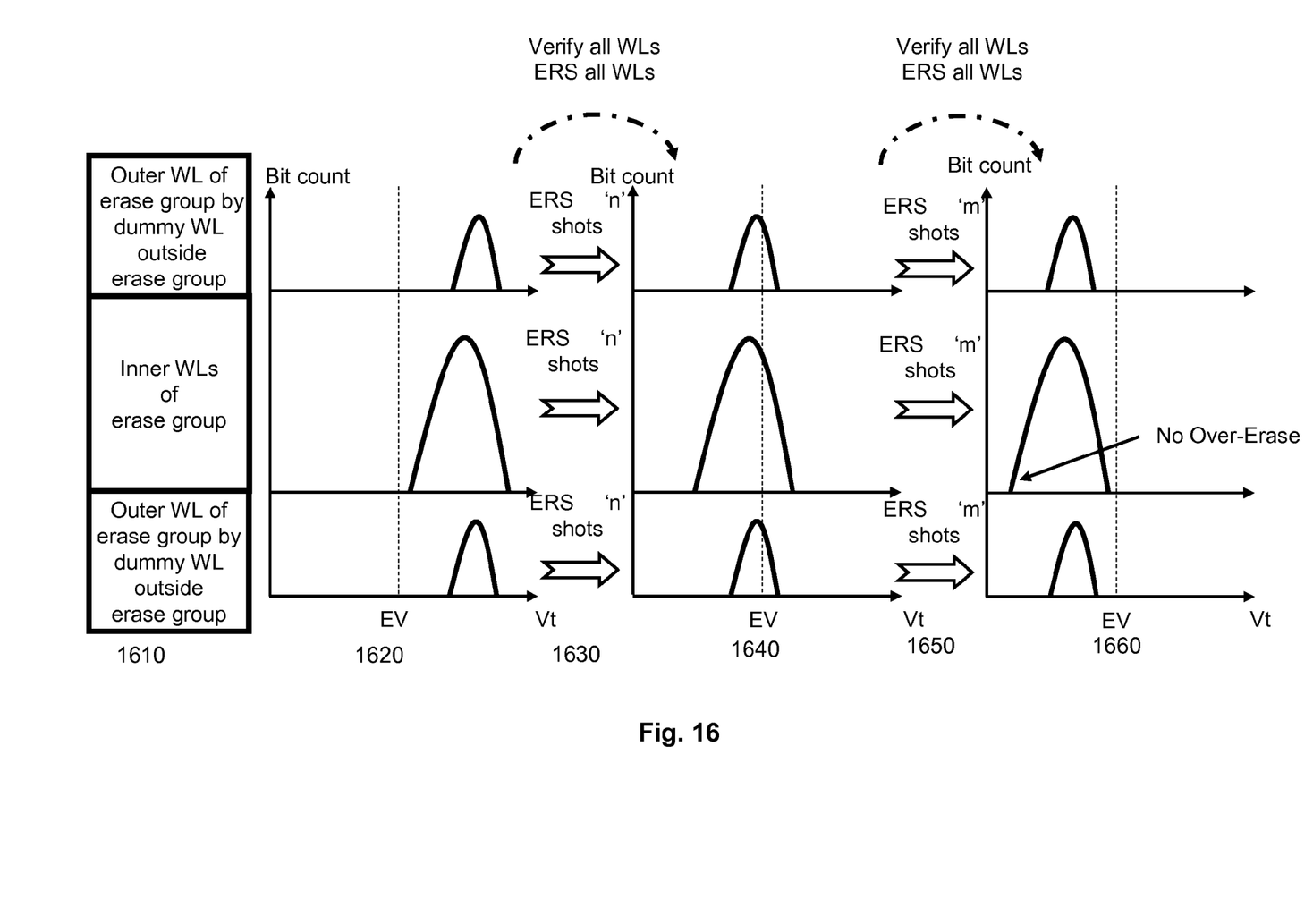
FIG. 16 shows multiple steps of an erase operation with multiple sub-operations of erase and erase verify, to show that electrical isolation between an outer word line of an erase group and a neighboring word line outside the erase group, results in no over-erasing of center word lines in the erase group.

FIG. 16 shows multiple steps of an erase operation with multiple sub-operations of erase and erase verify, to show that electrical isolation between an outer word line of an erase group and a neighboring word line outside the erase group, results in no over-erasing of center word lines in the erase group.

In 1610, the WLs of an erase group are shown as the inner WLs of an erase group ("Inner WLs of erase group"), between outer WLs of the erase group (top "Outer WL of erase group w/coupling effect" and bottom "Outer WL of erase group w/coupling effect"). In 1620, the threshold voltage distributions are shown for the inner and outer WLs, with horizontal axis of threshold voltage Vt and vertical axis "Bit count". Subsequently, "Verify all WLs" and "ERS all WLs" are performed as follows. In 1630, 'n' erase shots are performed on all WLs. In the threshold voltage distributions shown for the inner and outer WLs 1640, with horizontal axis of threshold voltage Vt and vertical axis "Bit count", all WLs have failed verify (erase verify voltage "EV" indicated by vertical dashed line) and have about the same Vt level due to no floating gate effect. Subsequently, "Verify all WLs" and "ERS all WLs" are performed as follows. In 1650, 'm' erase shots are performed on all WLs ("ERS 'n' shots"). In the threshold voltage distributions shown for the inner and outer WLs 1660, with horizontal axis of threshold voltage Vt and vertical axis "Bit count", although the outer WLs have passed erase verify (erase verify voltage "EV" indicated by vertical dashed line), and the inner region has not over-erased. Accordingly, the Vt distribution has not over-erased (shown in 1660 with arrow and indicated as "No Over-Erase").

No over-erase resulted in the Vt distribution, due to the electrical isolation between the floating gates of the outer WLs and the floating gates of neighboring WLs outside the erase group. Because the floating gate coupling effect is eliminated from the outer WLs, all WLs can be verified and erased, removing the over-erase effect.

Figure 17:
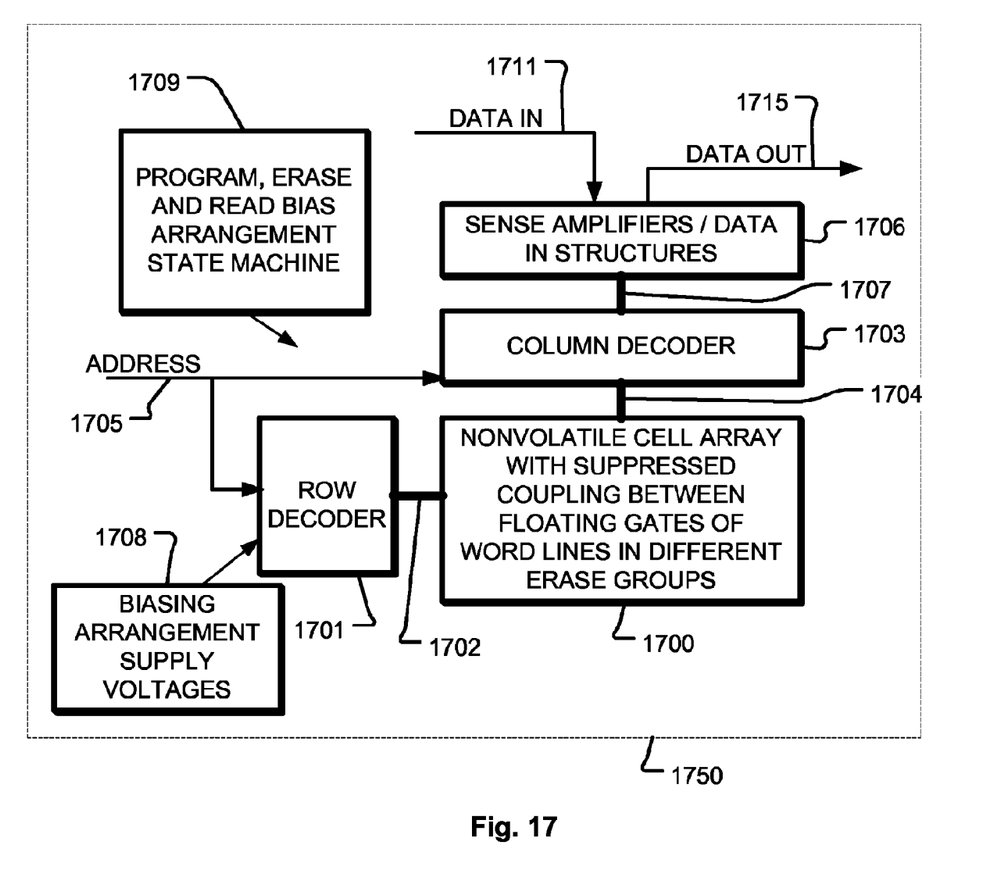
FIG. 17 is a simplified block diagram of an integrated circuit including a memory array implemented using any of the erase operation improvements as described herein.

FIG. 17 is a simplified block diagram of an integrated circuit including a memory array implemented using any of the erase operation improvements as described herein.

FIG. 17 is a simplified block diagram of an integrated circuit 1750 including a memory array 1700. The memory array 1700 has suppressed coupling between floating gates of word lines in different erase groups. For example, a multilevel bit line contact is between the outer word line of an erase group and a neighboring word line outside the erase group, to provide electrical isolation between their respective floating gates. In another example, a distance separates the outer word line of an erase group and a neighboring word line outside the erase group, to provide electrical isolation between their respective floating gates. A word line (or row) and block select decoder 1701 is coupled to, and in electrical communication with, a plurality 1702 of word lines and string select lines, and arranged along rows in the memory array 1700. A bit line (column) decoder and drivers 1703 are coupled to and in electrical communication with a plurality of bit lines 1704 arranged along columns in the memory array 1700 for reading data from, and writing data to, the memory cells in the memory array 1700. Addresses are supplied on bus 1705 to the word line decoder and drivers 1701 and to the bit line decoder 1703. Sense amplifiers and data-in structures in block 1706, including current sources for the read, program and erase modes, are coupled to the bit line decoder 1703 via the bus 1707. Data is supplied via the data-in line 1711 from input/output ports on the integrated circuit 1750, to the data-in structures in block 1706. Data is supplied via the data-out line 1715 from the sense amplifiers in block 1706 to input/output ports on the integrated circuit 1750, or to other data destinations internal or external to the integrated circuit 1750. State machine and improved clock circuitry are in circuitry 1709, controlling biasing arrangement supply voltages 1708.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory apparatus, comprising:
    a plurality of memory cells;
    a plurality of word lines accessing the plurality of memory cells, the plurality of word lines divided into a plurality of erase groups, wherein responsive to an erase command an erase group is selected from the plurality of erase groups to receive an erase bias arrangement, wherein the erase group includes:
        at least a first outer selected word line bounding (i) the erase group of word lines selected to receive the erase bias arrangement, from (ii) unselected word lines outside the erase group,
        wherein the first outer selected word line neighbors a first unselected word line outside the erase group;
    a first plurality of multilevel contacts between (i) the first outer selected word line and (ii) the first unselected word line neighboring the first outer selected word line, and
    control circuitry responsive to the erase command by selecting the erase group from the plurality of erase groups to receive the erase bias arrangement, and applying the erase bias arrangement to the erase group.

2. The memory apparatus of claim 1, wherein responsive to the erase command, the control circuit applies an erase inhibit voltage to at least the first unselected word line, at least partly while applying the erase bias arrangement to the erase group.

3. The memory apparatus of claim 1, wherein responsive to the erase command, the control circuit allows the first unselected word line to float, and other unselected word lines grounded or receiving an erase inhibit voltage, at least partly while applying the erase bias arrangement to the erase group.

4. The memory apparatus of claim 1, wherein the first unselected word line is a dummy word line.

5. The memory apparatus of claim 1, wherein the first unselected word line is not a dummy word line, and during regular operation accesses memory cells of the plurality of memory cells.

6. The memory apparatus of claim 1, wherein the erase group includes:
    a second outer selected word line bounding (i) the erase group of word lines selected to receive the erase bias arrangement, from (ii) unselected word lines outside the erase group,
    wherein the second outer selected word line neighbors a second unselected word line outside the erase group, and the apparatus includes:

a second plurality of multilevel contacts between (i) the second outer selected word line and (ii) the second unselected word line neighboring the second outer selected word line.

7. The memory apparatus of claim 1, further comprising:
a plurality memory elements under the plurality of word lines, including:
- a first memory element under the first outer selected word line; and
- a second memory element under the first unselected word line neighboring the first outer selected word line,
- such that the first plurality of multilevel contacts is between (i) the first memory element under the first outer selected word line and (ii) the second memory element under the first unselected word line neighboring the first outer selected word line.

8. A memory apparatus, comprising:
a plurality of memory cells;
a plurality of word lines accessing the plurality of memory cells, the plurality of word lines divided into a plurality of erase groups, wherein responsive to an erase command an erase group is selected from the plurality of erase groups to receive an erase bias arrangement, wherein the erase group includes:
- at least a first outer selected word line bounding (i) the erase group of word lines selected to receive the erase bias arrangement, from (ii) unselected word lines outside the erase group, and
- inner selected word lines;
- wherein the first outer selected word line neighbors (i) one of the inner selected word lines and (ii) a first unselected word line outside the erase group;
- wherein a first distance separates the first outer selected word line from the first unselected word line, a second distance separates adjacent ones of the inner selected word lines, and the first distance is greater than the second distance;
control circuitry responsive to the erase command by selecting the erase group from the plurality of erase groups to receive the erase bias arrangement, and applying the erase bias arrangement to the erase group.

9. The memory apparatus of claim 8, wherein responsive to the erase command, the control circuit applies an erase inhibit voltage to the first unselected word line, at least partly while applying the erase bias arrangement to the erase group.

10. The memory apparatus of claim 8, wherein responsive to the erase command, the control circuit allows the first unselected word line to float, at least partly while applying the erase bias arrangement to the erase group.

11. The memory apparatus of claim 8, wherein the first unselected word line is a dummy word line.

12. The memory apparatus of claim 8, wherein the first unselected word line is not a dummy word line, and during regular operation accesses memory cells of the plurality of memory cells.

13. An operation method of a memory, comprising:
performing on a memory integrated circuit having a plurality of word lines divided into a plurality of erase groups, an erase command selecting an erase group to receive an erase bias arrangement including:
applying the erase bias arrangement to word lines in the erase group, wherein the erase group includes:
- at least a first outer selected word line bounding (i) the erase group of word lines selected to receive the erase bias arrangement, from (ii) unselected word lines outside the erase group,
- wherein the first outer selected word line neighbors a first unselected word line outside the erase group; and
electrically isolating (i) a first memory element under the first outer selected word line from (ii) a second memory element under the first unselected word line neighboring the first outer selected word line.

14. The method of claim 13, wherein said electrically isolating is performed by a plurality of multilevel contacts between (i) the first outer selected word line and (ii) the first unselected word line neighboring the first outer selected word line.

15. The method of claim 13,
wherein the first outer selected word line neighbors (i) the first unselected word line outside the erase group and (ii) an inner selected word line in the erase group,
wherein said electrically isolating is performed by a first distance separating the first outer selected word line from the first unselected word line, the first distance being greater than a second distance separating adjacent ones of inner selected word lines.

16. The method of claim 13, further comprising:
responsive to the erase command, applying an erase inhibit voltage to the first unselected word line, at least partly while applying the erase bias arrangement to the erase group.

17. The method of claim 13, further comprising:
responsive to the erase command, allowing the first unselected word line to float, at least partly while applying the erase bias arrangement to the erase group.

18. The method of claim 13, wherein the first unselected word line is a dummy word line.

19. The method of claim 13, wherein the first unselected word line is not a dummy word line, and during regular operation accesses memory cells of the plurality of memory cells.

20. The method of claim 13, wherein the first and second memory elements are floating gates.

* * * * *